United States Patent
Lu et al.

(10) Patent No.: US 10,680,727 B2
(45) Date of Patent: Jun. 9, 2020

(54) OVER THE AIR WIRELESS TEST SYSTEM FOR TESTING MICROELECTRONIC DEVICES INTEGRATED WITH ANTENNA

(71) Applicant: MEDIATEK INC., Hsin-Chu (TW)

(72) Inventors: Yen-Ju Lu, Hsinchu (TW); Chih-Ming Hung, San Jose, CA (US); Wen-Chou Wu, Hsinchu (TW); Nan-Cheng Chen, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/056,549

(22) Filed: Aug. 7, 2018

(65) Prior Publication Data
US 2019/0068300 A1    Feb. 28, 2019

Related U.S. Application Data

(60) Provisional application No. 62/551,265, filed on Aug. 29, 2017.

(51) Int. Cl.
| | |
|---|---|
| *H04B 1/38* | (2015.01) |
| *H04B 17/16* | (2015.01) |
| *G01R 31/28* | (2006.01) |
| *G01R 31/302* | (2006.01) |
| *G01R 1/24* | (2006.01) |
| *G01R 29/08* | (2006.01) |
| *G01R 1/04* | (2006.01) |

(52) U.S. Cl.
CPC ......... *H04B 17/16* (2015.01); *G01R 31/2822* (2013.01); *G01R 31/3025* (2013.01); *G01R 1/045* (2013.01); *G01R 1/24* (2013.01); *G01R 29/0821* (2013.01)

(58) Field of Classification Search
CPC ...... G06F 16/683; H04H 60/37; H04H 60/40; H04N 21/44
See application file for complete search history.

(56) References Cited

U.S. PATENT DOCUMENTS

| | | | |
|---|---|---|---|
| 4,507,660 A | 3/1985 | Hemming | |
| 5,631,661 A | 5/1997 | Sanchez | |
| 5,910,729 A | 6/1999 | Yun | |
| 9,606,143 B1 * | 3/2017 | Sherry | ................. G01R 1/0466 |

(Continued)

FOREIGN PATENT DOCUMENTS

| | | |
|---|---|---|
| CN | 105980867 A | 9/2016 |
| TW | 201729459 A | 8/2017 |
| WO | 2017/062291 A1 | 4/2017 |

*Primary Examiner* — Md K Talukder
(74) *Attorney, Agent, or Firm* — Wolf, Greenfield & Sacks, P.C.

(57) ABSTRACT

An over-the-air (OTA) wireless test system includes a container, a machine plate disposed on the container, a supporter disposed on the machine plate, a load board disposed on the supporter, a socket disposed on the load board, a device under test (DUT) installed in the socket, and a wave-guiding feature in the socket and the load board configured to pass and guide electromagnetic waves to and/or from an antenna structure of the DUT. The wave-guiding feature comprises a wave-guiding channel in the socket defined by a plurality of pogo pins surrounding the antenna structure of the DUT. The wave-guiding feature may further comprise a radiation passage in the load board defined by rows of via fence extending through an entire thickness of the load board.

18 Claims, 7 Drawing Sheets

(56) References Cited

U.S. PATENT DOCUMENTS

| | | | |
|---|---|---|---|
| 2009/0153158 A1 | 6/2009 | Dunn | |
| 2013/0278349 A1 | 10/2013 | Dayan | |
| 2015/0168450 A1* | 6/2015 | Wooden | G01R 1/07371 324/756.02 |
| 2015/0168486 A1* | 6/2015 | Isaac | G01R 1/045 324/756.02 |
| 2015/0260390 A1* | 9/2015 | Bretschneider | F21V 19/0055 362/294 |
| 2016/0025788 A1* | 1/2016 | Fujita | G01R 1/045 343/703 |
| 2016/0164184 A1* | 6/2016 | Li | H01Q 1/52 343/752 |
| 2016/0341790 A1* | 11/2016 | Thompson | H01Q 1/2283 |
| 2017/0102409 A1* | 4/2017 | Sarhad | G01R 1/045 |
| 2018/0003754 A1* | 1/2018 | Schrattenecker | G01R 31/302 |
| 2019/0068300 A1* | 2/2019 | Lu | G01R 31/2822 |

\* cited by examiner

OVER THE AIR WIRELESS TEST SYSTEM FOR TESTING MICROELECTRONIC DEVICES INTEGRATED WITH ANTENNA

CROSS REFERENCE TO RELATED APPLICATIONS

This application claims priority from U.S. provisional application No. 62/551,265 filed Aug. 29, 2017, the subject matter of which is hereby incorporated by reference.

BACKGROUND

This disclosure relates generally to the field of wireless testing of semiconductor integrated circuit devices and, more particularly, to an over-the-air (OTA) wireless test system.

Semiconductor devices that have undergone complicated processing are subjected to various types of electrical tests so as to test their characteristics and for defects thereof. The radio frequency (RF) of a microelectronic device such as a chip package integrated with RF transmitter and/or receiver circuitry is typically tested by using RF automatic test equipment. For testing such a chip package with an integrated antenna or wireless device under test (DUT), a load board, which is conductively connected to the RF instrumentation circuitry, is typically used. The load board may have a socket for receiving the chip package.

However, the prior art OTA wireless test system does not provide adequate accuracy and performance. It is desirable to be able to provide improved ways of testing wireless DUTs in an OTA wireless test system. It is also desirable to provide improved OTA wireless test system with adequate accuracy and performance.

SUMMARY

The main object of the present invention is to provide an improved over-the-air (OTA) wireless test system to overcome the deficiencies and disadvantages of the prior art.

According to one aspect of the invention, an over-the-air (OTA) wireless test system is disclosed. The OTA wireless test system includes a container, a machine plate disposed on the container, a supporter disposed on the machine plate, a load board disposed on the supporter, a socket disposed on the load board, a device under test (DUT) installed in the socket, and a wave-guiding feature in the socket and the load board configured to pass and guide electromagnetic waves to and/or from an antenna structure of the DUT. The DUT may be an antenna-in package (AIP) or a RF die. The wave-guiding feature comprises a wave-guiding channel in the socket defined by a plurality of pogo pins surrounding the antenna structure of the DUT. The wave-guiding feature may further comprise a radiation passage in the load board defined by rows of via fence extending through an entire thickness of the load board.

The supporter may be a metal supporter. The supporter may comprise two leg portions and a top plate integrally formed with the two leg portions. Each of the leg portions has an oblique inner surface such that an inner space defined by the supporter has a trapezoid cross-sectional profile. A through opening is provided in the top plate and the through opening is aligned with the radiation passage in the load board. The supporter further comprises two side portions that have shorter length than that of the leg portions. Each of the side portions has an oblique inner surface extending from the through opening to a sidewall surface. A tilt angle of the oblique inner surfaces of the side portions is greater than that of the oblique inner surface of each of the leg portions. The supporter has two opposite sidewall surfaces, and each sidewall surface is adhered with an electromagnetic wave absorber material layer.

According to another aspect of the invention, a method for testing the DUT integrated with antenna is disclosed. For example, the DUT is installed in the socket by using the automated handler. The socket is mounted on the load board that is installed on a supporter so as to electrically connect the DUT with circuitry of the load board. The wave-guiding features in the socket and the load board are configured to pass and guide electromagnetic waves to and/or from the antenna structure of the DUT. A test of the DUT is performed. For example, a test signal may be sent to the DUT through the load board. The RF test signal is then radiated from the antenna structure of the DUT. An associated RF test signal reflected off an object is then received by the antenna structure of the DUT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" are used interchangeable throughout the specification to mean integrated circuit chip or die. The term "horizontal" as used herein may be defined as a direction parallel to a plane or surface (e.g., surface of a substrate or a stage), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

Wireless microelectronic devices usually undergo many kinds of tests in order to ensure sufficient performance and to verify their RF functionalities. Some tests are mandated by standards, while others are performed as part of product development and verification. A particular class of tests is that where the over-the-air (OTA) performance of the communication between one or several wireless transmitter and receivers is tested.

When a radio frequency signal is transmitted from a transmitter to a receiver, the signal propagates in a radio channel along one or more paths having different angles of arrivals, signal delays, polarizations and powers, which cause fading of different durations and strengths in the received signal. In addition, noise and interference due to other transmitters interfere with the radio connection.

The present disclosure pertains to an over-the-air (OTA) wireless test system having improved wave guiding structures configured in the socket, the load board, and the supporter, such that the electromagnetic wave propagation can be well controlled, and the performance and accuracy of the wireless testing can be enhanced.

Figure 1:
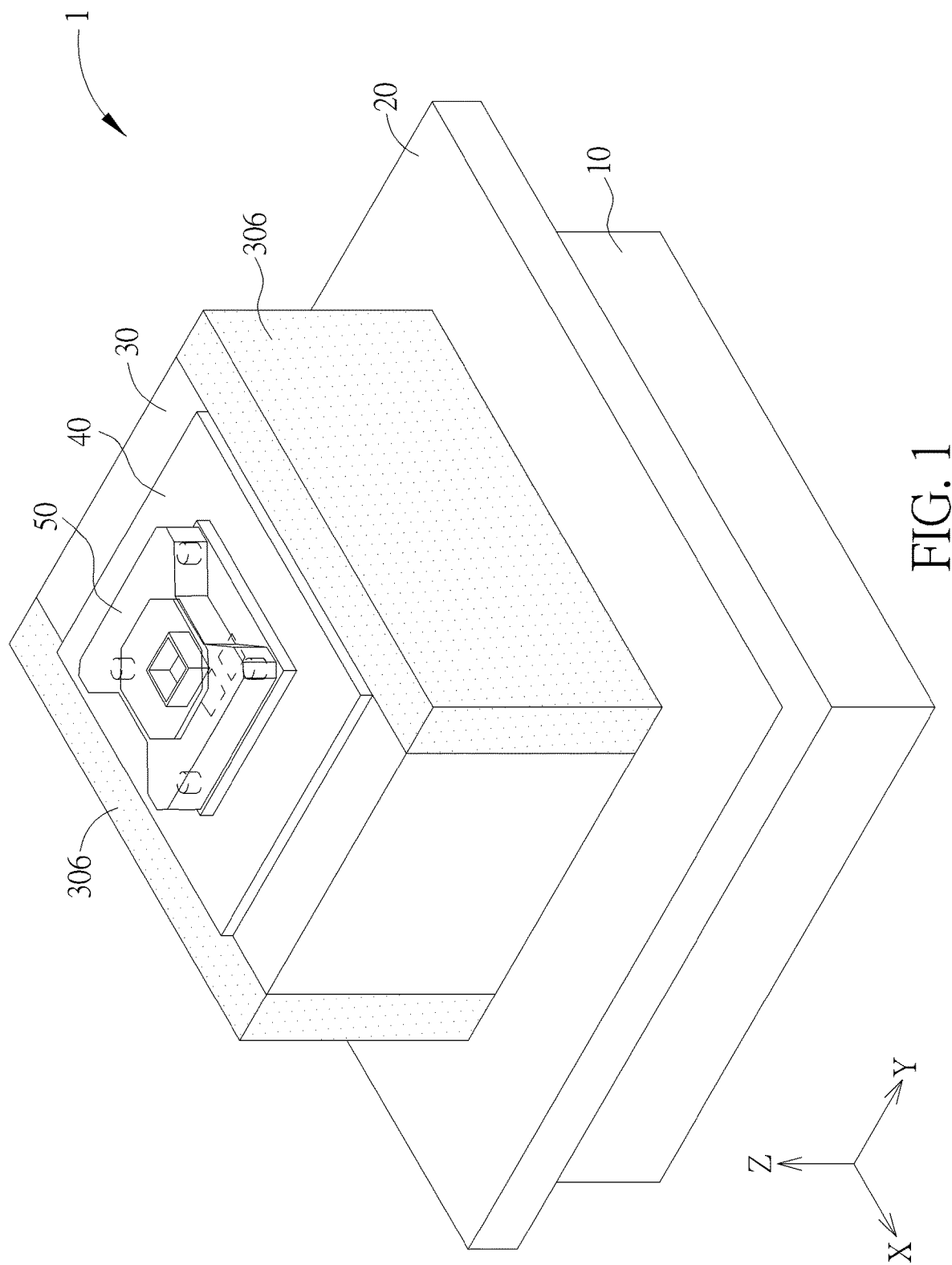
FIG. 1 is a schematic, perspective view of an exemplary over-the-air (OTA) wireless test system in accordance with one embodiment of the invention.
Figure 2:
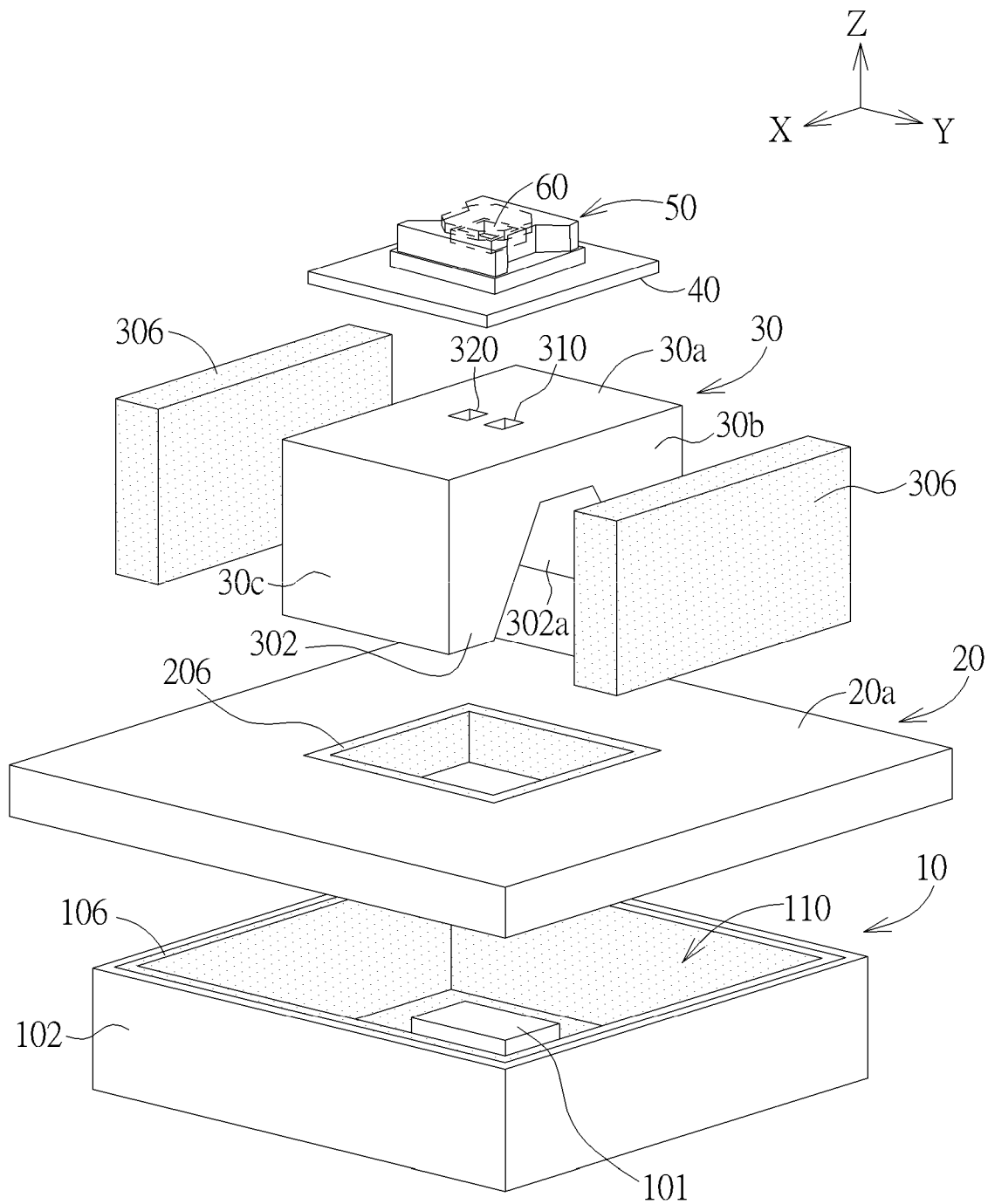
FIG. 2 is a perspective exploded view showing the parts of the OTA wireless test system of FIG. 1.
Figure 3:
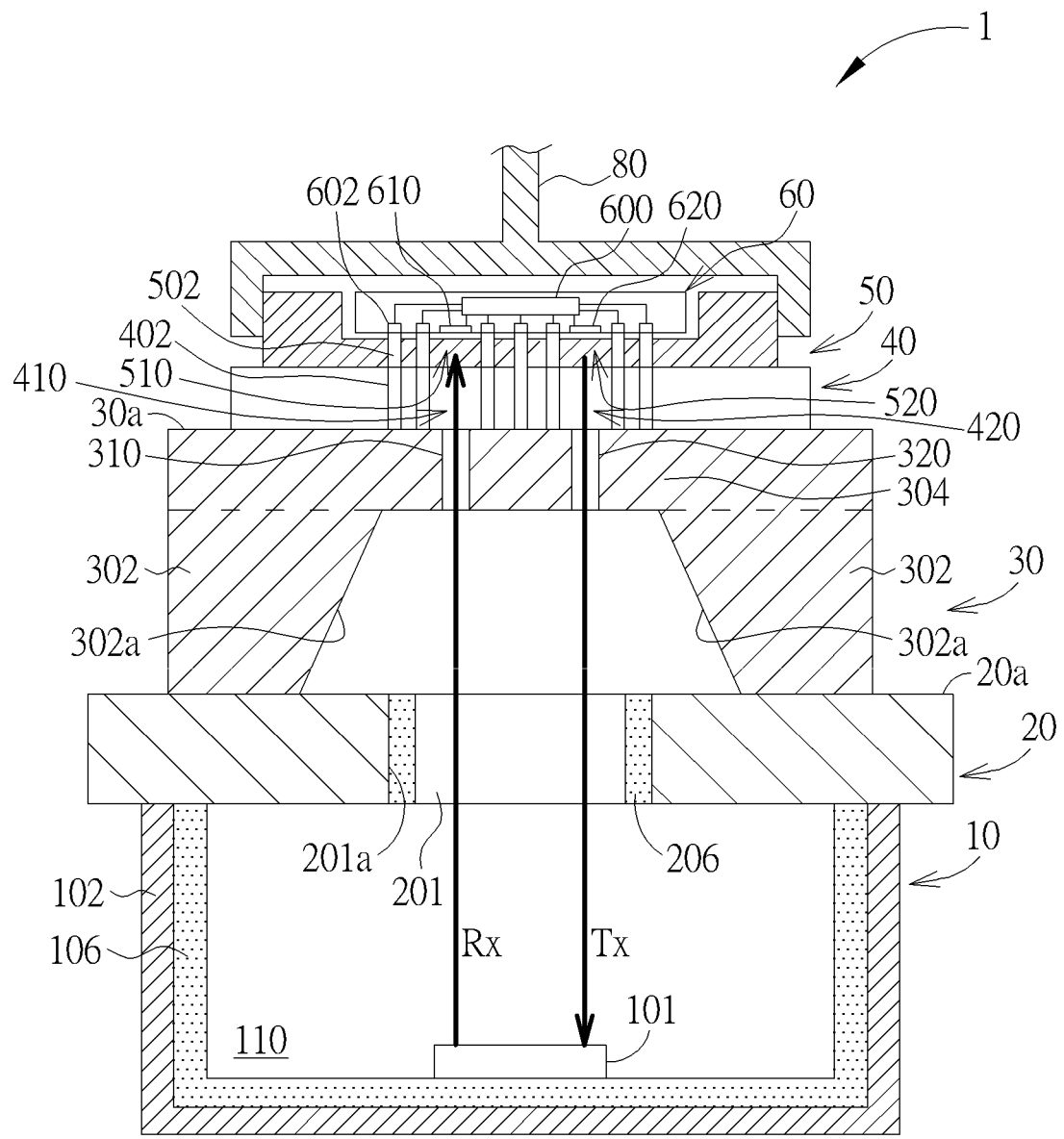
FIG. 3 is a schematic, cross-sectional view taken along the XZ plane in FIG. 1.

Please refer to FIG. 1 to FIG. 3. FIG. 1 is a schematic, perspective view of an exemplary over-the-air (OTA) wireless test system in accordance with one embodiment of the invention. FIG. 2 is a perspective exploded view showing the parts of the OTA wireless test system of FIG. 1. FIG. 3 is a schematic, cross-sectional view taken along the XZ plane in FIG. 1.

In a non-limiting example, the configuration depicted through FIG. 1 to FIG. 3 may be applicable to the wireless testing of a device under test (DUT) or an integrated antenna-in package (AIP) having a transmitter that may produce electromagnetic waves in the radio or microwaves domain, a transmitting antenna, a receiving antenna, a receiver, and a processor to determine properties of an object. For example, radio waves from the transmitter reflect off the object and return to the receiver, giving information about the object's location and speed.

As shown in FIG. 1 to FIG. 3, the OTA wireless test system 1 may comprise a container 10 (or a box), a machine plate 20 (or a metal lid) placed above the container 10, a supporter 30 disposed on the machine plate 20, a load board 40 disposed on the supporter 30, a socket 50 disposed on the load board 40, and a device under test (DUT) 60 integrated with antenna installed in and received by the socket 50. The container 10, the machine plate 20, the supporter 30, the load board 40, and the socket 50 are stacked and aligned along the reference Z axis. The machine plate 20 covers the opening of the container 10, thereby defining a testing chamber 110. An object 101 to be tested is positioned in the testing chamber 110.

As can be best seen in FIG. 3, the DUT 60 may be an integrated circuit package or an integrated circuit module having therein integrated antenna structures 610 and 620. The DUT 60 may be a SoC, a system in a package, or a module that has at least one radio frequency (RF) die 600. The radio frequency (RF) die 600 may have an on-chip RF transmitter and/or receiver circuitry that are associated with and coupled to the antenna structures 610 and 620.

According to one embodiment of the invention, the socket (e.g., a custom test socket) 50 may have a cavity that receives the DUT 60, but is not limited thereto. The socket 50 is used to electrically connect metallic wires or contact pads of the load board 40 (e.g., a printed circuit board) mounted in test equipment and external terminals of the DUT 60 (e.g., a semiconductor package). The socket 50 comprises a plurality of pogo pins 502 for providing temporary conductive connection with the DUT 60 and the load board 50. During testing, the DUT 60 with its antenna structures 610 and 620 facing downwardly to the object 101 to be tested is held against the pogo pins 502 such that these pogo pins 502 are aligned with and electrically connected to respective contact points or pads 602 on a lower surface of the DUT 60. The DUT 60 may be installed in the socket 60 by an automated handler 80 that can pick up the DUT 60 and place it on the socket 60. The automated handler 80 may grip or hold the combination of the DUT 60 and the socket 50 and may install them on the load board 40.

According to one embodiment of the invention, the pogo pins 502 may be composed of metal materials, such as copper, but is not limited thereto. According to one embodiment of the invention, the pogo pins 502 are designed to surround each of the antenna structures 610 and 620 so as to define wave-guiding channels 510 and 520, in the socket 50. No pogo pin is disposed within the wave-guiding channels 510 and 520.

The load board 40 may be a multi-layer printed circuit board or a multi-layer printed wiring board, which may comprise a core (e.g., FR4 copper clad laminate core), a plurality of dielectric build-up layers and traces on opposite surfaces of the core. The traces in different levels of the printed circuit board are electrically connected to one another by plated through vias 402 or plated through holes.

Figure 4:
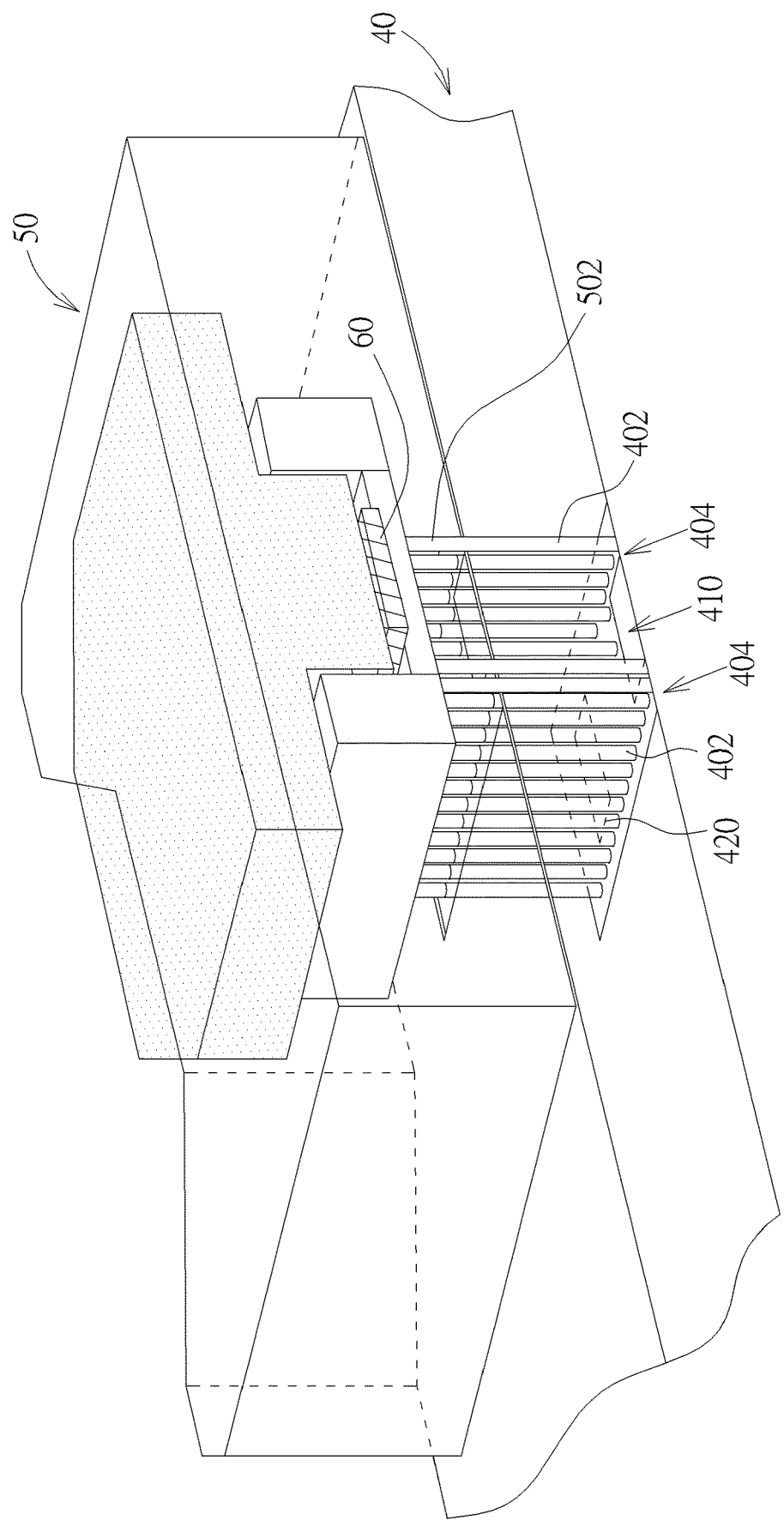
FIG. 4 is a perspective enlarged view showing the cross section of the load board and the socket in accordance with one embodiment of the invention.

Please refer to FIG. 3 and FIG. 4. FIG. 4 is a perspective enlarged view showing the cross section of the load board 40 and the socket 50. According to one embodiment of the invention, analogous to the pogo pins 502, some of the plated through vias 402 are constructed as rows of via fence 404 extending through an entire thickness of the load board 40, which define radiation passages 410 and 420 in the load board 40 to pass and guide electromagnetic waves to and/or from the integrated antenna structures 610 and 620 of the DUT 60. It is understood that the rest of the plated through vias 402 is not shown in this figure for the sake of simplicity. According to one embodiment of the invention, the via fence 404 may be electrically connected to a ground plane of the load board 40.

According to one embodiment of the invention, no metal trace or plated through via is disposed in the radiation passages 410 and 420. That is, the radiation passages 410 and 420 only comprise insulating laminate portions of the load board 40, for example, the dielectric build-up layers, the insulating portions of the core, and the solder mask (not shown), but is not limited thereto.

The wave-guiding features including the wave-guiding channels 510 and 520 defined by the pogo pins 502 in the socket 50 and the radiation passages 410 and 420 defined by the via fence 404 in the load board 40 can significantly enhance the performance of the OTA test. According to the experimental results, the antenna gain is approximately −3 dBi when utilizing the OTA wireless test system comprising the aforesaid wave-guiding features including the wave-guiding channels 510 and 520 in the socket 50 and the radiation passages 410 and 420 in the load board 40.

According to one embodiment of the invention, the supporter 30 may be a metal supporter, but is not limited thereto. According to one embodiment of the invention, the supporter 30 is installed directly on a top surface 20a of the machine plate 20. According to one embodiment of the invention, the supporter 30 may comprise two opposite leg portions 302 and a top plate 304 integrally formed with the two leg portions 302. As can be best seen in FIG. 3, the two opposite leg portions 302 have the same length or height such that when the supporter 30 is placed on the top surface 20a of the machine plate 20, a top surface 30a of the top plate 304 is in parallel with the top surface 20a of the machine plate 20. Each of the leg portions 302 has an oblique inner surface 302a such that the inner space defined by the supporter 30 may have a trapezoid cross-sectional profile, or more specifically, an isosceles trapezoid profile. Two through openings 310 and 320 are provided in the top plate 304. The two through openings 310 and 320 are aligned with the radiation passages 410 and 420 in the load board 40, respectively.

The supporter 30 has two opposite sidewall surfaces 30b, which are adhered with electromagnetic wave absorber material layers 306. The other two opposite sidewall surfaces 30c of the supporter 30 are exposed. According to one embodiment of the invention, the electromagnetic wave absorber material layer 306, the supporter 30, and the machine plate 20 define an enclosed space for the passage of the electromagnetic wave.

Figure 5:
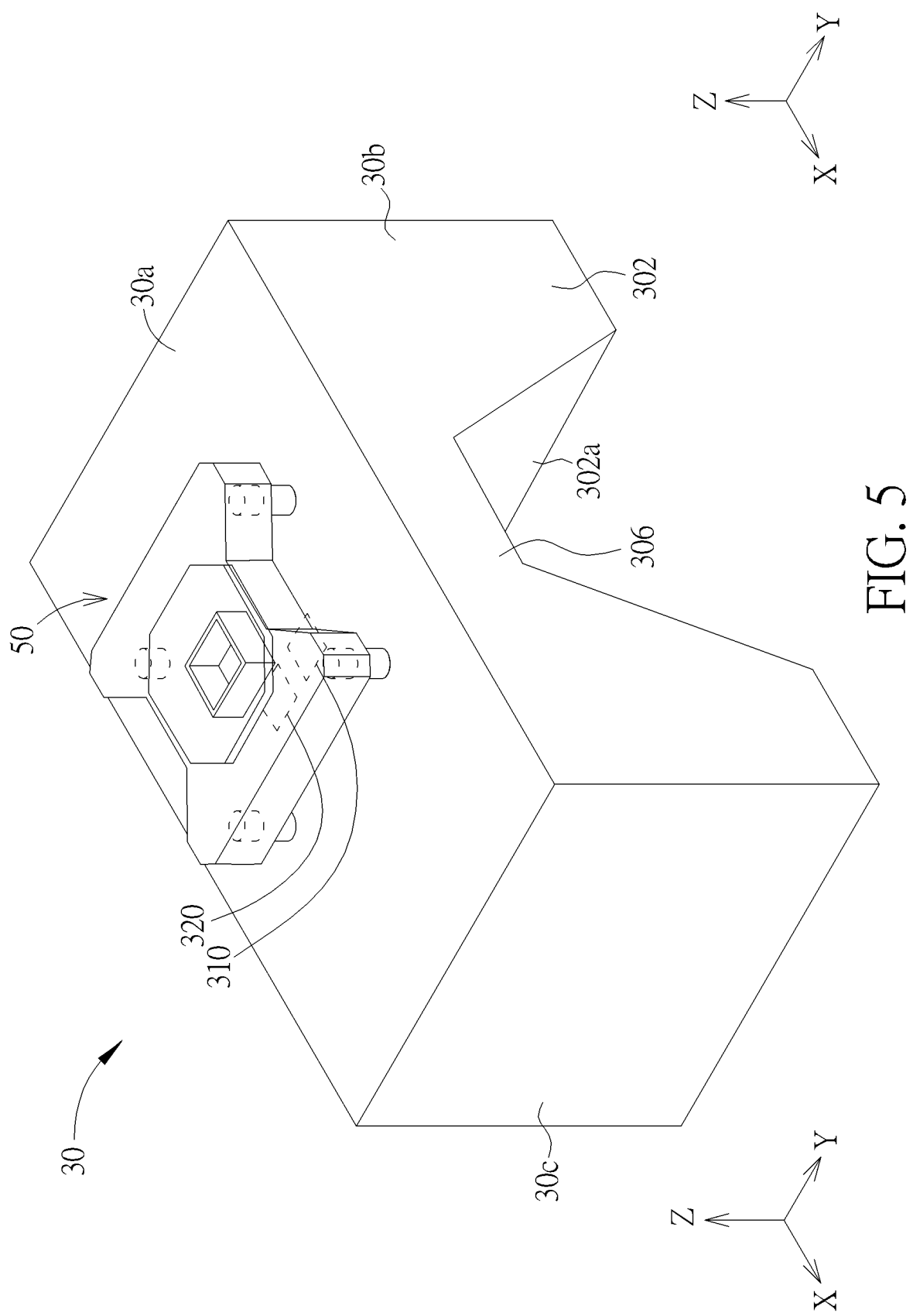
FIG. 5 and FIG. 6 are perspective views of the supporter observed from a top side and a bottom side, respectively.
Figure 6:
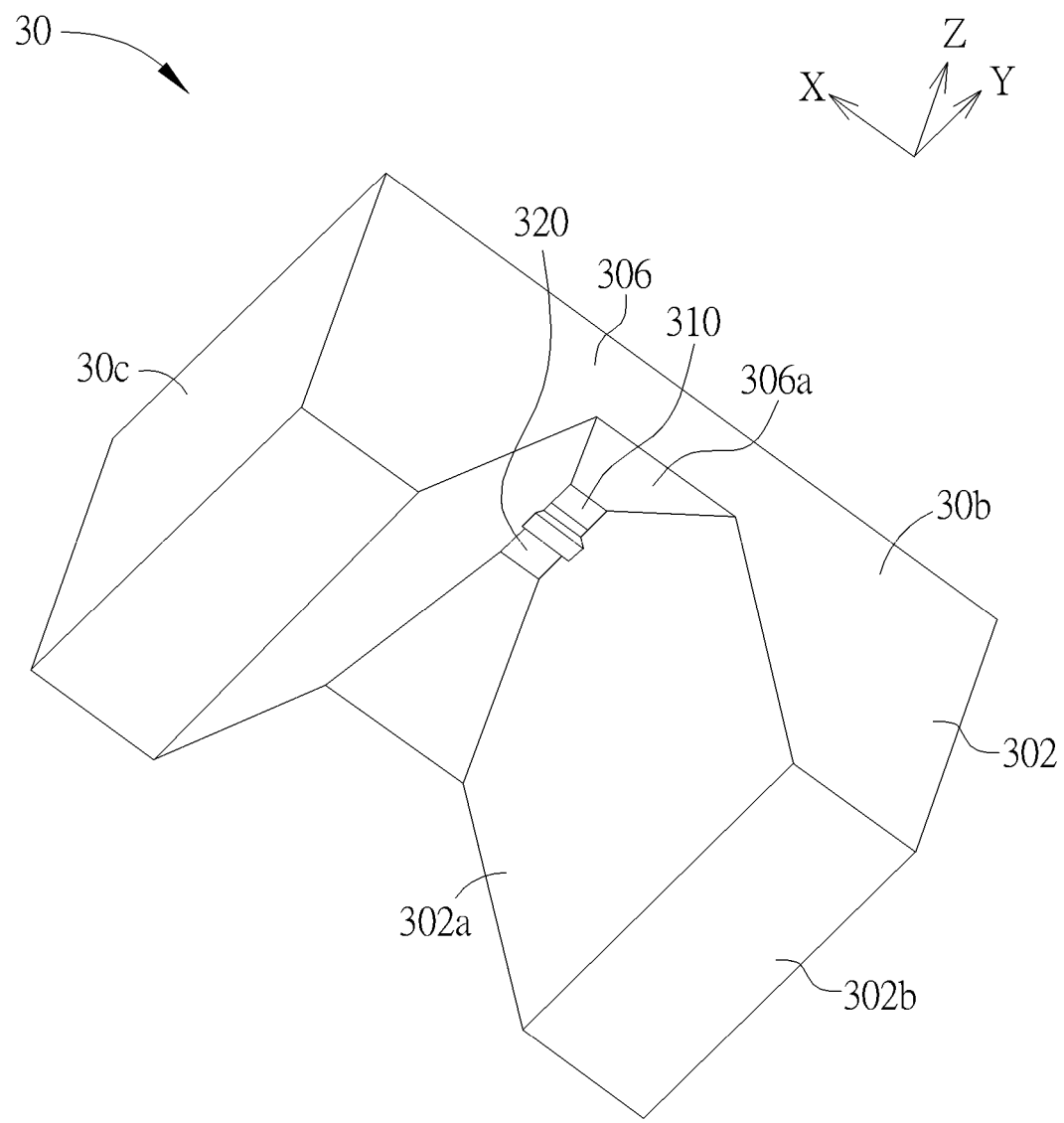

FIG. 5 and FIG. 6 are perspective views of the supporter observed from a top side and a bottom side, respectively. FIG. 5 basically shows the top surface 30a, a sidewall surface 30b and a sidewall surface 30c of the supporter 30. FIG. 3 basically shows the bottom surfaces 302b and the inner surfaces 302a of the leg portions 302 of the supporter 30. As can be seen in FIG. 6, the supporter 30 further comprises two side portions 306 that have shorter length than that of the leg portions 302. The side portions 306 also have oblique inner surfaces 306a extending from one of the through openings 310 and 320 to the sidewall surface 30b. The tilt angle of the oblique inner surfaces 306a is greater than that of the oblique inner surfaces 302a to more properly guide the wave pattern and field distribution along the YZ plane.

According to one embodiment of the invention, the machine plate 20 has an aperture 201 that is situated directly above the object 101 to be tested. The electromagnetic wave such as microwave or radio frequency (RF) signal transmitted from the DUT having an integrated antenna may pass through the aperture 201 and may be reflected off the object 101. According to one embodiment of the invention, the peripheral surface 201a of the aperture 201 may be lined with an electromagnetic wave absorber material layer 206.

According to one embodiment of the invention, the container 10 has four sidewalls 102 and a bottom plate 104 integrally connecting to the four sidewalls 102. According to one embodiment of the invention, the interior surface or inner walls of the container 10 may be lined with an electromagnetic wave absorbing material layer 106 designed to absorb reflected signals to thereby provide a non-reflective and echo-free chamber.

The present disclosure also provides a method for testing the DUT integrated with antenna. For example, first, the DUT 60 is installed in the socket 50 by using the automated handler. The socket 50 is then mounted on the load board 40 that is installed on a supporter 30 so as to electrically connect the DUT 60 with circuitry of the load board 40. As previously mentioned, the wave-guiding features in the socket and the load board are configured to pass and guide electromagnetic waves to and/or from the antenna structure of the DUT 60. Subsequently, a test of the DUT 60 is performed. For example, a test signal may be sent to the DUT 60 through the load board 40. The RF test signal is then radiated from the antenna structure of the DUT 60. An associated RF test signal reflected off an object is then received by the antenna structure of the DUT 60.

Figure 7:
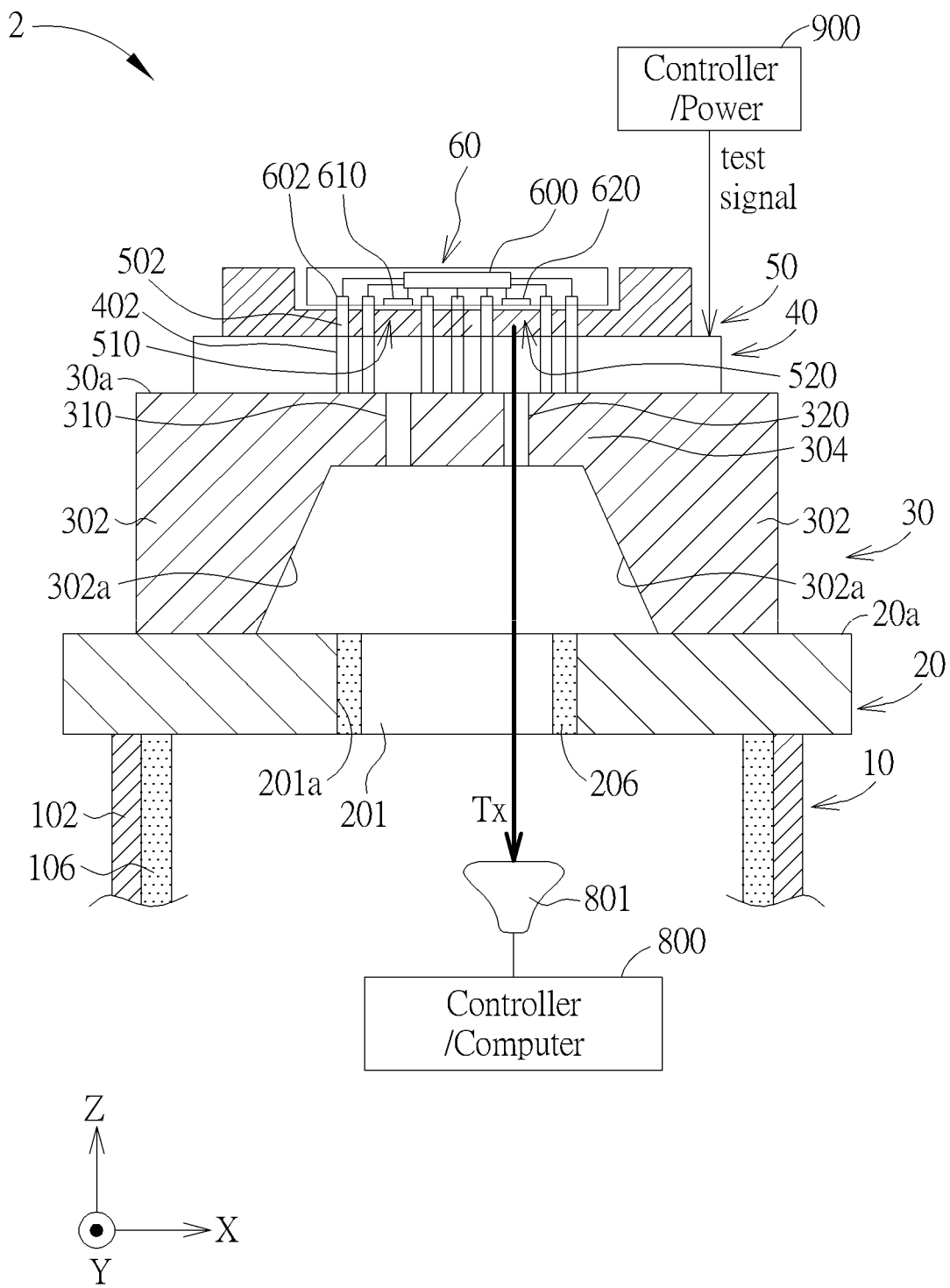
FIG. 7 is a schematic, perspective view of an exemplary OTA wireless test system in accordance with another embodiment of the invention.

FIG. 7 is a schematic, perspective view of an exemplary OTA wireless test system in accordance with another embodiment of the invention, wherein like numeral numbers designate like elements, regions or layers.

As shown in FIG. 7, the OTA wireless test system 2 may comprise a container 10 (or a box), a machine plate 20 (or a metal lid) placed above the container 10, a supporter 30 disposed on the machine plate 20, a load board 40 disposed on the supporter 30, a socket 50 disposed on the load board 40, and a device under test (DUT) 60 received by the socket 50. The container 10, the machine plate 20, the supporter 30, the load board 40, and the socket 50 are stacked and aligned along the reference Z axis. The machine plate 20 covers the opening of the container 10, thereby defining a testing chamber 110. A test antenna 801 is positioned in the testing chamber 110.

Likewise, the socket 50 comprises wave-guiding channels 510 and 520 defined by the pogo pins 502 in the socket 50 for wave guiding purposes. The load board 40 comprises radiation passages 410 and 420 defined by the via fence 404 in the load board 40. The wave-guiding channels 510 and 520 defined by the pogo pins 502 in the socket 50 and the radiation passages 410 and 420 defined by the via fence 404 in the load board 40 can significantly enhance the performance of the OTA test. Likewise, the supporter 30 has oblique inner surfaces 302a.

One difference between the OTA wireless test system 2 depicted in FIG. 7 and the OTA wireless test system 1 in FIG. 3 is that the object 101 to be tested in FIG. 3 is replaced with a test antenna 801. The test antenna 801 may be electrically connected to a controller computer 800 for signal analysis purposes.

It is to be understood that the system may further comprise other processing or functional units such as signal processing units, power supply units, and/or converter units, etc. These processing or functional units are known in the art and are therefore not shown in the figures.

As shown in FIG. 7, the test antenna 801 is positioned in the testing chamber 110 and is aligned with the aperture 201 of the machine plate 20. The test antenna 801 is designed to receive and/or transmit radiation wave such as millimeter wave (mmw) through the passage, from and/or to the DUT integrated with antenna. The load board 40 may be electrically connected to a controller and/or power unit 900 to transmit and/or receive signals for testing of the DUT 60 and/or provide DC power to the DUT 60.

The present disclosure also provides a method for testing the DUT integrated with antenna. For example, first, the DUT 60 is installed in the socket 50 by using the automated handler. The socket 50 is then mounted on the load board 40 that is installed on a supporter 30 so as to electrically connect the DUT 60 with circuitry of the load board 40. As previously mentioned, the wave-guiding features in the socket and the load board are configured to pass and guide electromagnetic waves to and/or from the antenna structure of the DUT 60. Subsequently, a test of the DUT 60 is performed. For example, a test signal may be sent to the DUT 60 through the load board 60. An associated radiated test signal radiated from the antenna structure of the DUT 60 is received by the test antenna 801.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An over-the-air (OTA) wireless test system, comprising a container;
   a machine plate disposed on the container; a supporter disposed on the machine plate; a load board disposed on the supporter; a socket disposed on the load board; a device under test (DUT) installed in the socket; and
   a wave-guiding feature in the socket and the load board configured to pass and guide electromagnetic waves to and/or from an antenna structure of the DUT, wherein the wave-guiding feature is comprised of a plurality of pogo pins embedded in the socket and rows of via fence penetrating through the load board, wherein each of the plurality of pogo pins is aligned with each via of the rows of via fence, wherein the rows of via fence surround a radiation passage in the load board through which the electromagnetic waves pass between the rows of via fence.

2. The OTA wireless test system according to claim 1, wherein the machine plate covers an opening of the container, thereby defining a testing chamber.

3. The OTA wireless test system according to claim 2, wherein an object to be tested is positioned in the testing chamber.

4. The OTA wireless test system according to claim 2, wherein a test antenna is positioned in the testing chamber.

5. The OTA wireless test system according to claim 1, wherein the DUT is an antenna-in package (AIP).

6. The OTA wireless test system according to claim 1, wherein the DUT comprises a radio frequency (RF) die.

7. The OTA wireless test system according to claim 1, wherein the plurality of pogo pins surrounds the antenna structure of the DUT.

8. The OTA wireless test system according to claim 1, wherein said each via of said rows of via fence extends through an entire thickness of the load board, wherein said rows of via fence define a radiation passage in the load board for guiding said electromagnetic waves to and/or from said antenna structure of the DUT.

9. The OTA wireless test system according to claim 8, wherein the load board is a printed circuit board comprising a core and a plurality of dielectric build-up layers and traces on opposite surfaces of the core.

10. The OTA wireless test system according to claim 8, wherein the radiation passage only comprise insulating laminate portions of the load board.

11. The OTA wireless test system according to claim 1, wherein the supporter is a metal supporter comprising two leg portions and a top plate integrally formed with the two leg portions.

12. The OTA wireless test system according to claim 11, wherein each of the leg portions has an oblique inner surface such that an inner space defined by the supporter has a trapezoid cross-sectional profile.

13. The OTA wireless test system according to claim 12, wherein a through opening is provided in the top plate, wherein the through opening is aligned with the radiation passage in the load board.

14. The OTA wireless test system according to claim 13 wherein the supporter further comprises two side portions that have shorter length than that of the leg portions.

15. The OTA wireless test system according to claim 14 wherein each of the side portions has an oblique inner surface extending from the through opening to a sidewall surface, and wherein a tilt angle of the oblique inner surfaces of the side portions is greater than that of the oblique inner surface of each of the leg portions.

16. The OTA wireless test system according to claim 11, wherein the supporter has two opposite sidewall surfaces, wherein each of the two opposite sidewall surfaces is adhered with an electromagnetic wave absorber material layer.

17. The OTA wireless test system according to claim 1, wherein the machine plate has an aperture and a peripheral surface of the aperture is lined with an electromagnetic wave absorber material layer.

18. The OTA wireless test system according to claim 1, wherein the container has four sidewalls and a bottom plate integrally connecting to the four sidewalls, and wherein the interior surface or inner walls of the container is lined with an electromagnetic wave absorbing material layer.

* * * * *